United States Patent [19]

Adin et al.

[11] 4,239,848

[45] Dec. 16, 1980

[54] PHOTOCROSSLINKABLE CARBONYL-CONTAINING POLYMERIC COMPOSITION AND ELEMENT WITH COBALT COMPLEX

[75] Inventors: Anthony Adin; John C. Wilson, both of Rochester, N.Y.

[73] Assignee: Eastman Kodak Company, Rochester, N.Y.

[21] Appl. No.: 15,541

[22] Filed: Feb. 26, 1979

Related U.S. Application Data

[63] Continuation-in-part of Ser. No. 918,865, Jun. 26, 1978, abandoned, which is a continuation-in-part of Ser. No. 872,852, Jan. 27, 1978, abandoned.

[51] Int. Cl.$^2$ .......................... G03C 1/00; G03C 1/68
[52] U.S. Cl. .............................. 430/270; 204/159.24; 430/302; 430/325; 430/907; 430/923; 525/327; 525/357; 430/936

[58] Field of Search ................ 96/33, 35.1, 115 R, 96/85; 528/270, 239, 231; 204/159.21, 159.24; 430/270, 302, 323, 905, 907, 923, 936, 325

[56] References Cited

U.S. PATENT DOCUMENTS

| | | | |
|---|---|---|---|
| 3,062,652 | 11/1962 | Jeffreys et al. | 96/111 X |
| 3,297,440 | 1/1967 | Delzenne et al. | 96/35.1 |
| 3,625,694 | 12/1971 | Cohen et al. | 96/84 A |
| 3,804,628 | 4/1974 | Osada et al. | 96/115 R X |
| 3,852,256 | 12/1974 | Parker et al. | 96/115 R X |
| 4,025,348 | 5/1977 | Tsukada et al. | 96/115 R |
| 4,045,221 | 8/1977 | Dominh | 96/88 X |
| 4,108,839 | 8/1978 | Chambers et al. | 96/115 R X |

*Primary Examiner*—Edward C. Kimlin
*Attorney, Agent, or Firm*—Dana M. Schmidt

[57] ABSTRACT

There is disclosed a composition, element, and process of imaging, wherein a polymeric binder is rendered photocrosslinkable by virtue of a photoresponsive source of amines, and by virtue of one or more carbonyl groups on the binder which react with said amines to form a carbinolamine.

24 Claims, No Drawings

PHOTOCROSSLINKABLE CARBONYL-CONTAINING POLYMERIC COMPOSITION AND ELEMENT WITH COBALT COMPLEX

RELATED APPLICATIONS

This application is a continuation-in-part application of U.S. Ser. No. 918,865, filed on June 26, 1978, which in turn is a continuation-in-part of U.S. Ser. No. 872,852, filed on Jan. 27, 1978, both now abandoned.

INTRODUCTION (1) Field of the Invention this invention relates to a photocrosslinkable composition and element useful in lithographic printing plates, photoresists, color-proofing materials and the like.

(2) Background of the Invention

Lithographic printing plates and photoresists commonly require the use of a crosslinkable polymer which (a) is light-sensitive, (b) provides a relatively high speed, and (c) is able to produce an olephilic, crosslinked photographic polymer. To meet these needs, conventional approaches have employed materials such as poly(vinylcinnamates), unsaturated polyesters, and cyclopropene polymers as taught, for example, in U. S. Pat. No. 3,782,938.

There is a continuing need to improve the photographic speed of such photocrosslinkable polymers. Prior to this invention a means for amplifying the speed of photocrosslinkable polymers generally has not been available, although amplifiers have been taught for photopolymerizable monomers and oligomers. Such amplifiers generally are free-radical producers, which, as is well known, cannot operate effectively in an oxygen-containing environment.

A chemistry has been discovered which will photoharden gelatin through the use of cobalt(III) complexes, as disclosed, e.g., in *Research Disclosure*, vol. 133, May 1975, Publication No. 13309, published by Industrial Opportunities Ltd., Homewell, Havant, Hampshire, P09 1EF, UK. The mechanism of this reaction is the photoreduction of cobalt(III) to cobalt(II) which in turn insolubilizes gelatin by forming a complex therewith. It is further known that photosensitive redox reactions of cobalt(III) complexes can be amplified through the use of certain chelating compounds which in the presence of cobalt(II) form further reducing agents that reduce more cobalt(III) in turn forming more cobalt(II) (amplification). Examples are disclosed in U.S. Pat. No. 4,045,221, issued on Aug. 30, 1977 and U.S. Pat. No. 4,075,019, issued Feb. 21, 1978. However, amplification of the photohardening of gelatin would not be available by combining the teachings of these documents, as the chelating compounds would sequester cobalt(II) and prevent the gel hardening. Furthermore, gelatin and other hydrophilic colloids do not meet requirement (c) noted above; that is, they do not produce an oleophilic polymer. It is only with considerable difficulty that such colloids can be modified to have this property, so that generally hydrophilic colloids are not a preferred class of materials for use in lithographic printing plates.

SUMMARY OF THE INVENTION

In accordance with the present invention there is advantageously featured a photocrosslinkable composition and element which can have both an enhanced speed and oleophilic characteristics.

In a related aspect the present invention advantagesouly features a photocrosslinkable composition and element which can accommodate an amplifier that is not susceptible to oxygen poisoning.

The aforesaid features are achieved via a composition, element and imaging method wherein the composition contains, as a major portion thereof, a polymer with an active carbonyl group and as a minor portion thereof, a photoresponsive source of amines. More specifically, there is provided a photocrosslinkable composition comprising, as the major portion thereof, a polymeric binder containing a repeating unit bearing one or more carbonyl groups capable of reacting with an amine to form a carbinolamine; and as a minor portion thereof, the aforesaid source of amines.

The element can be prepared from such a composition by forming a layer of this composition on a suitable support. Such an element can be imaged by exposing it to activating radiation and by developing the exposed photocrosslinkable layer to form an image.

DESCRIPTION OF THE PREFERRED EMBODIMENTS

Although the invention is described hereinafter in connection with properties that render it particularly useful as a lighgraphic printing plate, such as the property of an oleophilic polymer having an amplifier photocrosslinking speed, the invention is not limited thereto. For example, it is applicable also to photoresists, color-proofing elements, and the like, all of which also derive considerable advantages from enhanced photocrosslinking speed.

It has been discovered that a photocrosslinkable composition having the capability of amplified speed can be provided wherein the minor portion of the composition comprises a photoresponsive source of amines and the major portion comprises a polymeric binder that is crosslinkable by the amines. Thermally stable, reducible metal complexes containing amine ligands are useful souces of amines. Amplification occurs by including in the composition an amplifier capable of increasing the speed of said photocrosslinking by generating additional reducing agents for said complex in the presence of reduction products of said complex. As used herein, "major" and "minor" or "majority" and "lesser" refer to weight % amounts greater or smaller, respectively, than about 50%.

The imaging process comprises imagewise exposure of such a composition, preferably on a support, followed by a development step to crosslink the polymeric binder at the exposed areas and to remove the noncrosslinked binder at the non-exposed areas, thereby forming a relief image.

Any polymer having recurring units bearing a carbonyl group capable of reacting with an amine to form a carbinolamine can be used as the binder. It will be appreciated that the carbinolamine may be only an intermediate stage prior to the formation of an imine, if primary amine ligands are the crosslinking agents. Such reactions between active carbonyls and amines are well known in general and are described, e.g., in R. L. Reeves, "Condensations Leading to Double Bonds", *The Chemistry of the Carbonyl Group*, 1966, pages 608-614. The formation of the carbinolamine requires that the carbonyl be active, that is, be capable of reacting chemically, as opposed to, for example, carbonyls which are sterically hindered or are prevented from reacting for any other reason by adjacent substitutent groups.

Useful examples of such carbonyls include ketones as well as alkehydes. As noted by Reeves in the aforesaid article, ketones are less reactive than aldehydes, but can be made to form carbinolamines by the use of conventional acid catalysts, higher reaction temperatures, or longer reaction times. Ketones contemplated as being especially useful as those having a structure

wherein M is a group that is more electron-withdrawing than methyl, such as for example, haloalkyl containing from 1 to 3 carbon atoms, for example, chloromethyl, trifluoromethyl and the like; or —CH₂M' wherein M' is nitro; alpha-beta unsaturated alkenyls and alkynyls, for example, propenyl, propynyl and the like; cyano; and the like.

Highly preferred exaples of useful, oleophilic polymers are those which are aliphatic or aromatic aldehydes containing recurring units having one or more of the following structures:

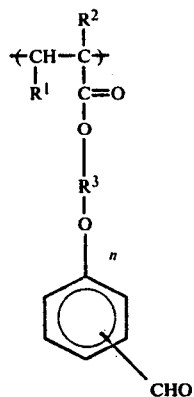

(I)

wherein
R¹ is hydrogen or carboxyl,
R² is hydrogen or alkyl containing from 1 to 3 carbon atoms, for example, methyl, propyl and the like;
R³ is alkylene such as methylene, ethylene, etc.; phenylenedialkylene or alkylenephenylene containing from 1 to 5 carbon atoms in the alkylene portions, for example, phenylenemethylene; and phenylene
and n is 0 or 1;

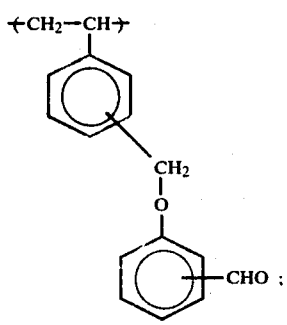

(II)*

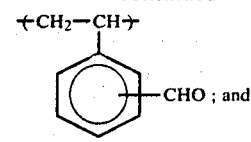

(III)

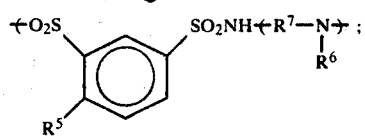

(IV)

*This polymer is described and claimed per se in commonly owned U.S. Application Serial No. 928,138, filed on July 26, 1978, entitled "Aldehyde-Containing Vinylaryl Ethers" by J. C. Wilson.

wherein
R⁵ is H or alkyl containing from 1 to 6 carbon atoms, such as methyl, ethyl, propyl, isopropyl and the like;
R⁶ is H or

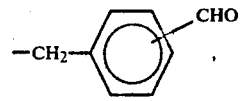

provided that in at least 10 mole % of the polymer, R⁶ is

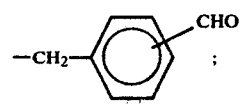

and
R⁷ is alkylene containing from 1 to about 8 carbon atoms, such as methylene, ethylene, isopropylene and the like.

Within the aforesaid classes of polymers are highly useful copolymers which can be prepared by copolymerizing the recurring units (I) or (II) with at least one other ethylenically unsaturated polymerizable monomer which forms addition polymers, such as vinyl esters, alpha-beta-unsaturated acids, vinyl amides, vinyl halide, vinyl nitriles, vinyl ketones, vinyl ethers, olefins, diolefins and the like, as exemplified by acrylamide; N-substituted acrylamide such as N,N-dimethylacrylamide and N-isopropylacrylamide; methacrylamides, methacrylonitrile; styrene; alpha-methylstyrene; vinyl chloride; methyl vinyl ketone; fumaric, maleic and itaconic esters; 2-chloroethyl vinyl ether; acrylic and methacrylic esters such as methyl acrylate, ethyl methacrylate, N-butyl acrylate and phenyl methacrylate; sodium methacryloyloxyethyl sulfate; dimethylaminoethyl methacrylate; sodium sulfonates such as 3-acryloyloxy-propane-1-sulfonic acid, 2-acrylamido-2-methylpropane-1-sulfonic acid, and 4,4,9-trimethyl-8-oxo-7-oxa-4-azonia-9-decene-1-sulfonic acid; N-vinylsuccinimide; N-vinylphthalimide; N-vinylpyrazolidinone; 2-, 3-, or 4-vinylpyridine; 1-vinylimidazole; butadiene; isoprene; vinylidene chloride; ethylene and the like.

Especially useful copolymers of the type described immediately hereinabove are copolymers containing the following recurring units:

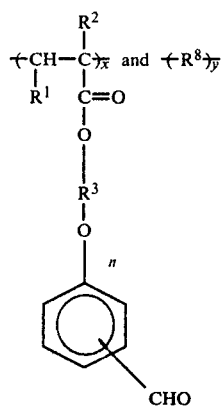
(V)

wherein $R^1$, $R^2$, $R^3$ and n are as described above; x and y are molar amounts of the repeating units such that the ratio x:y is from about 1:10 to about 10:1, of which highly preferred ratios are from about 2:8 to about 2:1; and $R^8$ is a recurring unit derived from an addition polymerizable cationic or anionic monomer which renders the polymer capable of aqueous processing, examples of the monomers being set forth hereinafter in Table I; or $R^8$ is derived from a monomer such as

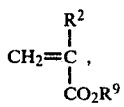

wherein $R^2$ is as desribed above, $R^9$ is alkyl containing from 1 to about 5 carbon atoms such as methyl, ethyl and the like, or $-NR^{10}R^{11}$; and wherein $R^{10}$ and $R^{11}$ are the same or different and are each alkyl containing from 1 to 5 carbon atoms, such as methyl, ethyl, propyl and the like; or $R^{10}$ and $R^{11}$ considered together are the necessary nonmetallic atoms to complete a heterocyclic ring containing from 5 to 6 ring atoms, whereby the polymer is soluble in an aqueous acidic solution. It will be appreciated that several different $R^8$ comonomers can be incorporated to form, e.g., a terpolymer. Still other useful examples of copolymers are those having recurring units with the following structure:

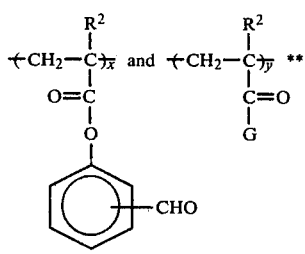
(VI)

**Polymers falling within this structure are described and claimed per se in a commonly owned U.S. Application Serial Nos. 022,407 and 022,406 filed on March 21, 1979, entitled "Polymerizable N-(Acryloyloxyaryl)-Sulfonamides" and "Polymerizable Acryloyloxyarylene Sulfonamides" by J.C. Wilson et al.

wherein
G is

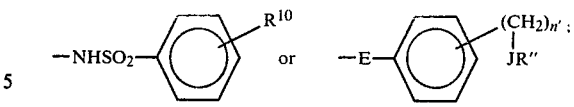

E is —O— or —NH—;
J is —SO$_2$NH— or —NHSO$_2$—;
n' is 0, 1, 2, 3, 4 or 5;
x, y, $R^2$ and $R^{10}$ are as defined above;
and R" is alkyl containing from 1 to about 5 carbon atoms such as methyl, ethyl, and the like, or aryl comprising from 6 to 10 carbon atoms, such as phenyl, naphthyl and the like;

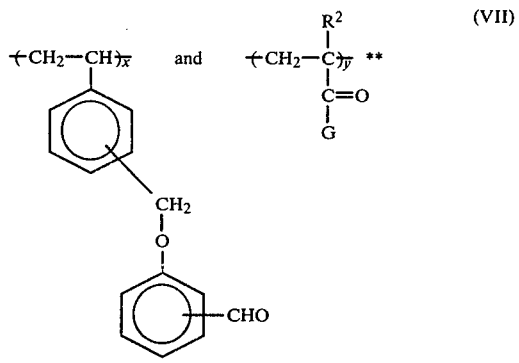
(VII)

**Polymers falling within this structure are described and claimed per se in a commonly owned U.S. Application Serial Nos. 022,407 and 022,406 filed on March 21, 1979, entitled "Polymerizable N-(Acryloyloxyaryl)-Sulfonamides" and "Polymerizable Acryloyloxyarylene Sulfonamides" by J. C. Wilson et al.

wherein x, y, $R^2$ and G are as defined above; and

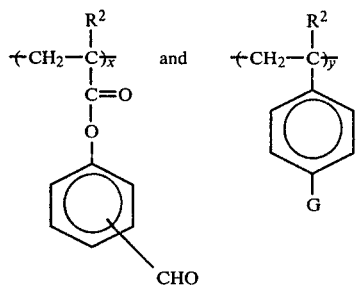
(VIII)

wherein x, y, $R^2$ and G are as defined above.

Table I: Preferred Examples of Addition Polymerizable Monomers Which Can Form Anionic or Cationic Polymers for Aqueous Processing N-(2-methacryloyloxyethyl)-N,N,N-trimethylammonium methosulfate
N-benzyl-N,N-dimethyl-N-vinylbenzylammonium chloride
Aconitic acid
2-Acrylamido-2-methylpropanesulfonic acid
3-Acrylamidopropane-1-sulfonic acid
Acrylic acid
Methacrylic acid
4-Acryloyloxybutane-1-sulfonic acid
3-Acryloyloxypropionic acid
3-Acryloyloxybutane-1-sulfonic acid
3-Acryloyloxypropane-1-sulfonic acid
4-t-Butyl-9-methyl-8-oxo-7-oxa-4-aza-9-decene-1-sulfonic acid α-Chloroacrylic acid
Maleic acid
Chloromaleic acid
2-Methacryloyloxyethyl-1-sulfonic acid
Citraconic acid
Crotonic acid
Fumaric acid
Mesaconic acid
α-Methyleneglutaric acid
Monoethyl fumarate
Monomethyl α-methyleneglutarate
Monomethyl fumarate
Vinylsulfonic acid
p-Styrenesulfonic acid
4-Vinylbenzylsulfonic acid
Acryloyloxymethylsulfonic acid
4-Methacryloyloxybutane-1-sulfonic acid
2-Methacryloyloxyethane-1-sulfonic acid
3-Methacryloyloxypropane-1-sulfonic acid
2-Acrylamidopropane-1-sulfonic acid
2-Methacrylamido-2-methylpropane-1-sulfonic acid
3-Acrylamido-3-methylbutane-1-sulfonic acid
Maleic anhydride It was particularly surprising that the charged, acidic polymers, e.g., polymers derived from comonomers of the type listed in Table I, or polymers of structure (I) above, wherein $R^1$ is carboxyl, were found to be useful, because it has been thought prior to this invention that acidic environments are detrimental to, or can inhibit the reduction of cobalt(III) complexes discussed hereinafter.

Examples of polymers containing aliphatic carbonyls include those having recurring units with the structures

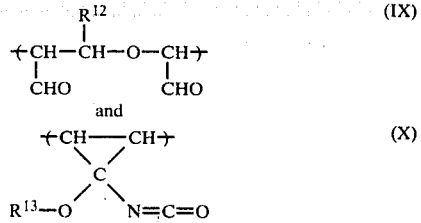

(IX)

and (X)

wherein
- $R^{12}$ is alkyl or hydroxyalkyl containing from 1 to 3 carbon atoms such as methyl, ethyl, hydroxymethyl, hydroxyethyl and the like; or hydrogen; and
- $R^{13}$ is one or more saturated carbocyclic rings containing from 6 to 10 carbon atoms, for example

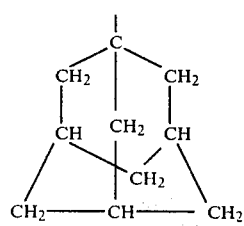

The polymers of structures (I) through (IV) can be prepared in a variety of ways. For example, a copolymer according to structure (I) can be prepared by the following reaction (1), wherein $R^1$ is carboxyl, $R^2$ is hydrogen and $R^3$ is ethylene and $n=1$.

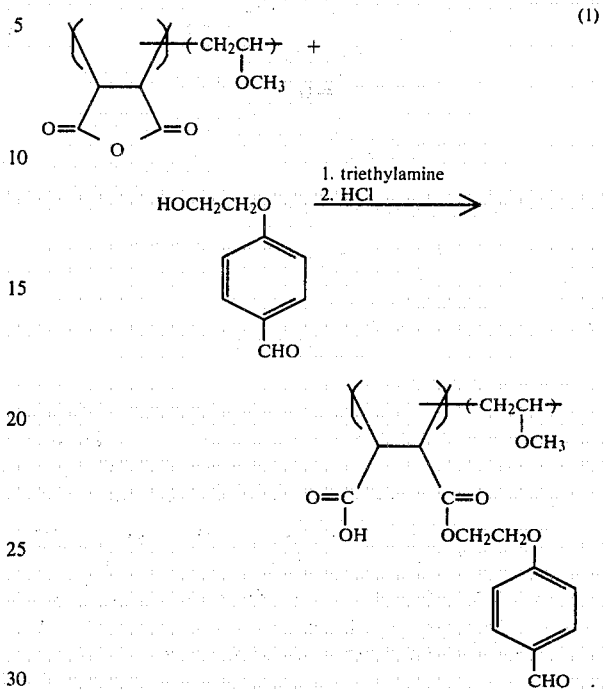

(1)

A homopolymer containing structure (II) can be prepared by the methods described in Gibson et al, *J. Polym. Sci., Poly. Chem. Ed.*, 12, p. 2141 (1974). Alternatively, a homo- or copolymer containing structure (II) can be prepared by the following reactions (2a) and (2b), wherein T is an α,β-ethylenically unsaturated monomer:

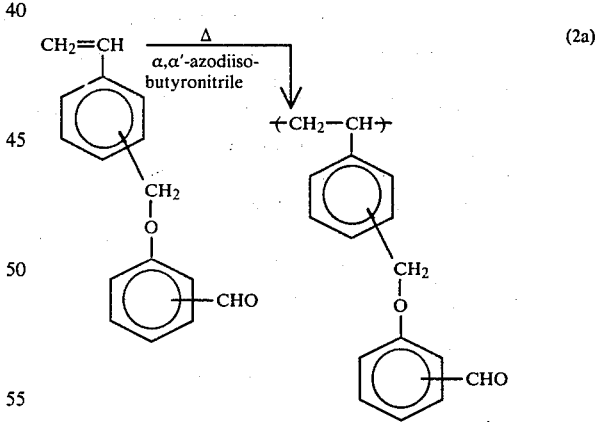

(2a)

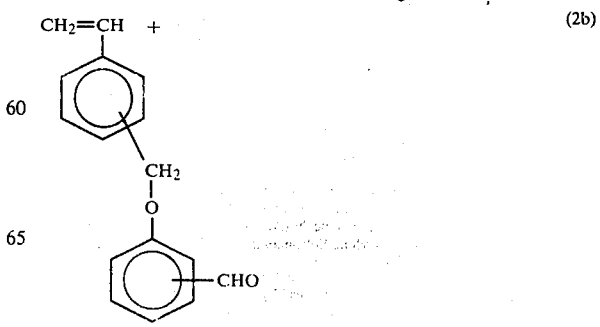

(2b)

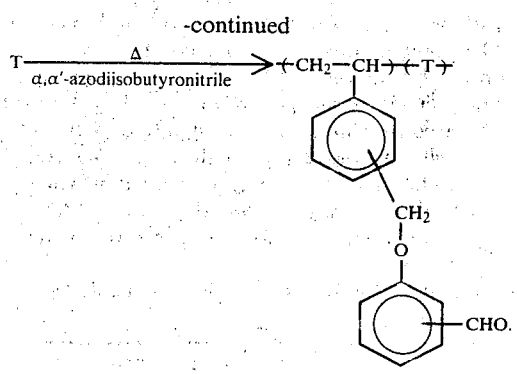

A homopolymer containing structure (III) can be prepared as described by Gibson and Bailey, *J. Polym. Sci., Poly. Chem. Ed.*, 13, p. 1951 (1975). Alternatively, homo- and copolymers containing structure (III) may be prepared by the following reactions (3a) and (3b):

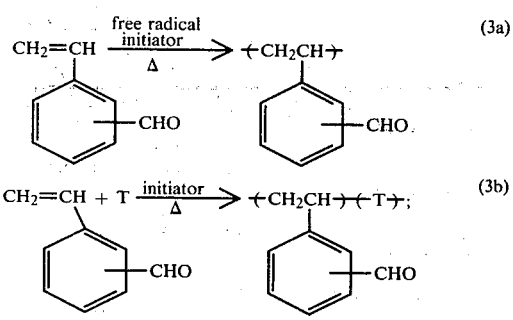

wherein T is as described above.

Condensation polymers are also contemplated, and particularly those having recurring units with the structure (IV) above. These can be prepared, e.g., by reaction (4), wherein $R^7$ is hexamethylene and $R^5$ is methyl.

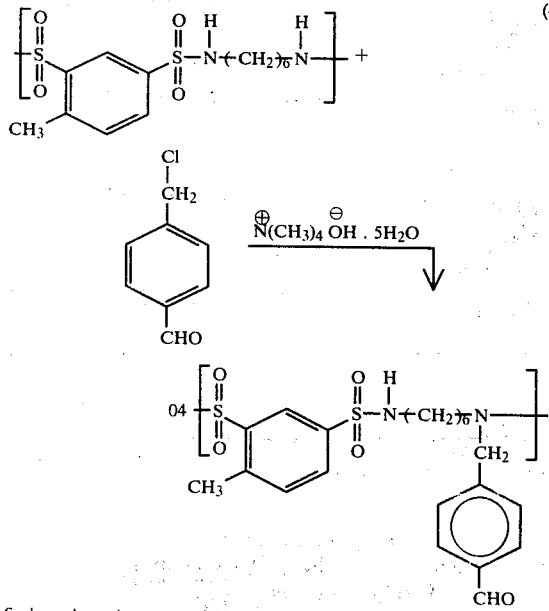

Such a polymer is acetone soluble and exhibits a $T_g$ of less than 90° C.

The following preparations will further illustrate useful derivations of the carbonyl-containing polymers used in this invention:

Preparation 1 - Poly[mono-2-(4-Formylphenoxy)ethyl Maleate-co-Methyl Vinyl Ether]

To a solution of 15.6 g (0.10 equivalents) of poly(-maleic anhydride:methyl vinyl ether), obtained as Gantrez AN-119, 16.6 g (0.10 mol) of p-(2-hydroxyethoxy) benzaldehyde and 425 ml of acetonitrile was added 10.1 g (0.10 mol) of triethylamine in four portions of 2.5 g, 2.5 g, 2.5 g, and 2.6 g over 5.67 hours. The solution was stirred for 16 hours. Concentrated hydrochloric aicd (10 ml) was then added. The mixture was then poured into water to precipitate polymer. The polymer was isolated, washed with water in a Waring blender, collected and dried at room temperature under high vacuum. The yield of polymer was 26.7 g (83.0 percent of theory).

Anal. Calc'd. for $C_{16}H_{18}O_7$: C, 59.6; H, 5.6. Found: C, 57.8; H, 6.0.

The inherent viscosity[1] of the polymer was determined to be 0.64 and the glass transition temperature to be 70° C.

[1]All inherent viscosities reported herein were measured in 1:1, by weight, phenol:chlorobenzene solvent at 25° C. at a concentration of 0.25 g/dl of solution.

Preparation 2 - Polymerization of m-Formylphenyl Methacrylate m-Formylphenyl methacrylate was prepared by adding 23.0 g of methacryloyl chloride over a 20-minute period to a −10° C. solution of 27.0 g of m-hydroxybenzaldehyde, 22.3 g of triethylamine and 133 ml of methylene chloride, keeping the reaction temperature in the −10° to 5° C. range. The mixture was stirred another 25 minutes at 0° C. and filtered; the solid collected was washed with methylene chloride. The combined filtrate and wash was washed three times with water and dried over sodium sulfate.

A small amount of 2,6-di-t-butyl-p-cresol inhibitor was added and the solution was concentrated in vacuo. Distillation of the oily residue gave 23.5 g (56.2 percent of theory) of m-formylphenyl methacrylate; bp=56°–73° C./5–10μ.

Anal. Calc'd. for $C_{11}H_{10}O_3$: C, 69.5; H, 5.3. Found: C, 68.8; H, 5.5.

A solution of 5.0 g of m-formylphenyl methacrylate and 20 ml of dioxane was purged with nitrogen. 2,2′-Azobis(2-methylpropionitrile catalyst), (0.025 g), was added and the solution was heated in a 60° C. bath with nitrogen bubbling for approximately 16 hours. The solution was poured into diethyl ether to precipitate the polymer, which was collected and dried in vacuo. The yield of polymer was 4.7 g (94.0 percent of theory).

Anal. Calc'd. for $C_{11}H_{10}O_3$: C, 69.5; H, 5.3. Found: C, 67.9; H, 5.8.

Property data for homopolymers of formylphenyl methacrylates, similarly prepared, can be found in Table II.

TABLE II

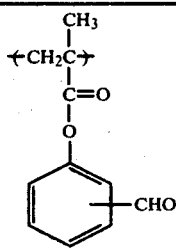

| CHO Substitution | {η}, dl/g | Calc'd. C | H | Found C | H | Tg, °C. |
|---|---|---|---|---|---|---|
| p | 0.53 | 69.5 | 5.3 | 68.0 | 5.8 | 98 |
| m | 0.31 | 69.5 | 5.3 | 67.9 | 5.8 | 93 |
| o | 0.32 | 69.5 | 5.3 | 69.0 | 5.2 | 108 |

Preparation 3 - Polymerization of m-Formylphenyl Methacrylate and N-Butyl-4-Methacryloyloxybenzenesulfonamide A solution of 3.80 g (0.02 mol) of m-formylphenyl methacrylate, 5.94 g (0.02 mol based on 100 percent conversion) of N-butyl-4-methacryloyloxybenzenesulfonamide and 40 ml of dioxane was purged with nitrogen. To this solution was added 0.05 g of 2,2'-azobis(2-methylpropionitrile). The solution was heated in a 60° C. bath with nitrogen bubbling for approximately 16 hours. The reaction solution was poured into diethyl ether, and the precipitated polymer was isolated, washed with ether and dried in vacuo. The yield of polymer was 8.0 g (82.1 percent of theory).

Anal. Calc'd. for $C_{25}H_{29}NO_7S$: C, 61.6; H, 6.0; N, 2.9; S, 6.6. Found: C, 61.2; H, 6.8; N, 2.7; S, 5.2.

Data and properties of other compolymers prepared from these monomers can be found in Table III.

TABLE III

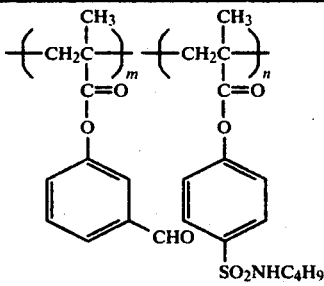

| m | n | {η}, dl/g | Calc'd. C | H | N | S | Found C | H | N | S |
|---|---|---|---|---|---|---|---|---|---|---|
| 50 | 50 | 0.27 | 61.6 | 6.0 | 2.9 | 6.6 | 61.2 | 6.8 | 2.7 | 5.2 |
| 50 | 50[2] | 1.34 | 61.6 | 6.0 | 2.9 | 6.6 | 62.4 | 6.4 | 2.1 | 5.1 |
| 33 | 67[2] | 1.27 | 59.7 | 6.2 | 3.6 | 8.2 | 58.3 | 7.0 | 3.0 | 7.0 |

[2]Prepared using 0.25% (wt) initiator based on monomers and approximately 50% solids concentration.

Preparation 4 - Preparation of Poly(o-Formylphenyl Vinylbenzyl Ether)

A mixture of 100.0 g (0.655 equivalents) of poly(vinylbenzyl chloride), 60:40 molar percent, 100.0 g (0.820 mol) of salicylaldehyde, 46.0 g of 85% potassium hydroxide, 327 ml of denatured ethanol and 1.21 liters of p-dioxane was heated at reflux for 22.75 hours and cooled. The mixture was then poured into water to precipitate polymer which was isolated and washed with water in a Waring blender with high speed stirring. The polymer was then collected, dissolved in tetrahydrofuran and reprecipitated in 2% sodium hydroxide. The polymer was again isolated, washed with water in a Waring blender and dissolved in tetrahydrofuran. The solution was filtered through a diatomaceous earth, poured into water and the precipitated polymer given a final water wash in the blender. After collecting and drying overnight in a low temperature vacuum oven, the yield was 113.0 g.

Derived copolymers are given in Table IV.

TABLE IV $+CH_2-CH)_m$  $+CH_2-CH)_n$ with pendant groups: (first) phenyl-CH₂-O-Q³, (second) phenyl-CH₂-O-phenyl

| Q³ | m³ | n³ | Yield of, % | {η}, dl/g | Calc'd. C | H | Found C | H |
|---|---|---|---|---|---|---|---|---|
| phenyl-CHO (para) | 100 | 0 | 63.0 | 1.07 | 80.6 | 5.9 | 80.1 | 6.0 |
| phenyl-CHO (para) | 100 | 0 | 67.2 | 1.04 | 80.6 | 5.9 | 80.2 | 6.1 |
| phenyl-CHO (para) | 50 | 50 | 58.3 | 0.41 | 83.0 | 6.3 | 82.0 | 6.2 |
| phenyl-CHO (meta) | 100 | 0 | 57.6 | 0.35 | 80.6 | 5.9 | 78.9 | 6.0 |
| naphthyl-CHO | 100 | 0 | 50.2 | 0.52 | 83.3 | 5.6 | 79.8 | 6.0 |
| naphthyl-CHO | 10 | 90 | 57.4 | 0.53 | 85.2 | 6.6 | 84.4 | 6.7 |
| phenyl (unsub) | 100 | 0 | 73.2 | 0.84 | 80.6 | 5.9 | 79.3 | 5.9 |
| phenyl-CHO (meta) | 50 | 50 | 76.2 | 0.52 | 83.0 | 6.3 | 81.5 | 5.8 |
| phenyl-CHO (meta) | 25 | 75 | 77.5 | 0.53 | 84.3 | 6.5 | 82.7 | 6.3 |
| phenyl-CHO (para) | 100 | 0 | 58.3 | 0.68 | 80.6 | 5.9 | 80.2 | 6.0 |
| phenyl-CHO (ortho) | 100 | 0 | 72.4 | 0.50[4] | 80.6 | 5.9 | 79.5 | 5.9 |

[3]Based on feed ratios.
[4]{η} measured in chloroform.

Preparation 5 - Poly[N-(4-Formylbenzyl)hexamethylene-2,4-Tolylenedisulfonamide]

To a solution of 9.0 g (0.0271 mol) of poly(hexamethylene-2,4-tolylenedisulfonamide) in 87 ml of N,N- dimethylformamide, was added 4.9 g (0.0271 mol) of tetramethyl ammonium hydroxide . pentahydrate. After two hours, 4.2 g (0.0271 mol) of 4-chloromethylbenzaldehyde was added to the mixture. The mixture was stirred for approximately 22 hours, filtered, and the filtrate poured into water in a Waring blender. The polymer was collected, washed again with water in a blender, collected and dried at room temperature under high vacuum. The yield of polymer was 9.3 g.

Anal. Calc'd. for $C_{21}H_{26}N_2S_2O_5$: C, 56.0; H, 5.8; N, 6.2; S, 14.2. Found: C, 54.1; H, 6.3; N, 6.3; S, 14.5.

The inherent viscosity of the polymer was determined to be 0.69.

The molecular weight of the polymer does not appear to be critical. The wide range of such weights is evidenced by the wide range of inherent viscosities found to be useful, when measured as described above. For example, at least one polymer is useful whether it has an inherent viscosity of 0.25 dl/g or an inherent viscosity of 1.4 dl/g. In addition however it should be noted that the higher molecular weights have in some instances produced a higher speed as evidenced by a greater number of 0.3 Log E steps, when coated as an element and exposed and developed as described hereinafter.

Any photoresponsive source of amines can be used as the minor constituent of the composition. Although the preferred sources hereinafter described include cobalt(III) complexes, other reducible metal amine complexes are also useful, for exampe, amine complexes of palladium(IV).

Preferably, the photoresponsive source of amines is a reducible, thermally stable cobalt(III) complex containing amine ligands, with or without an amplifier. The source of amines can include a cobalt(III) complex that is directly photoresponsive, or a totally nonphotoresponsive cobalt(III) complex combined with a photoresponsive photoactivator as described hereinafter.

Any cobalt(III) complex containing amine ligands will function in this invention, provided it is thermally stable within the processing temperatures used. Such complexes on occasion have been described as being "inert". An example of such a description occurs in U.S. Pat. No. 3,862,842. However, the ability of such complexes to remain stable, i.e., retain their original ligands when stored by themselves or in a neutral solution at room temperature until a chemically or thermally initiated reduction to cobalt(II) takes place, is so well known that the term "inert" will not be applied herein.

Such cobalt(III) complexes feature a molecule having a cobalt atom or ion surrounded by a group of atoms, ions or other molecules which are generically referred to as ligands. The cobalt atom or ion in the center of these complexes is a Lewis acid while the ligands are Lewis bases. While it is known that cobalt is capable of forming complexes in both its divalent and trivalent forms, trivalent cobalt complexes—i.e., cobalt(III) complexes—are employed in the practice of this invention, since the ligands are relatively tenaciously held in these complexes, and released when the cobalt is reduced to the (II) state. Thus, the reduction products of such a reaction are cobalt(II) and the ligands.

Preferred cobalt(III) complexes useful in the practice of this invention are those having a coordination number of six. A wide variety of amine ligands can be used with cobalt(III) to form cobalt(III) complexes, e.g., ethylenediamine, n-propylene diamine, diethylenetriamine, triethylenetetraamine, methylamine, iminodiacetate, ethylenediamine-tetraacetic acid, ammines, amino acids such as glycinato, and others. As used herein, "ammine" refers to ammonia specifically, when functioning as a ligand, whereas "amine" is used to indicate the broader class noted above, including ammonia.

The cobalt(III) complexes useful in the practice of this invention can be neutral compounds which are entirely free of either anions or cations. As used herein, "anion" refers to non-ligand anions, unless otherwise stated. As noted, the cobalt(III) complexes can also include one or more cations and anions as determined by the charge neutralization rule. Useful cations are those which produce readily soluble cobalt(III) complexes, such as alkali and quaternary ammonium cations.

A wide variety of anions can be used. However, if a conjugated π-bonding chelate amplifier is used with the complex, as hereinafter described, then preferably the composition is predominately free of anions which will form conjugate acids by deprotonation of a cobalt(II) complex containing the chelate amplifier. It has been found that such can be achieved by providing that less than 50 mole percent of the anions present are those having a pKa greater than 3.5.

In those few instances in which a complex may be only slightly soluble, increased amounts can be solubilized by adding other anionic equivalents thereof.

Further details of cobalt(III) complexes are set forth in *Research Disclosure,* Volume 135, July 1975, Publication No. 13505, published by Industrial Opportunities Ltd., Homewell, Havant, Hampshire, P09 1EF, UK, the details of which are expressly incorporated herein by reference.

Exemplary useful cobalt(III) complexes are set forth in Table V.

TABLE V

| | |
|---|---|
| C-1 | hexa-ammine cobalt(III) benzilate |
| C-2 | hexa-ammine cobalt(III) thiocyanate |
| C-3 | hexa-ammine cobalt(III) trifluoroacetate |
| C-4 | chloropenta-ammine cobalt(III) perchlorate |
| C-5 | bromopenta-ammine cobalt(III) perchlorate |
| C-6 | aquopenta-ammine cobalt(III) perchlorate |
| C-7 | bis(ethylenediamine) bisazido cobalt(III) perchlorate |
| C-8 | bis(ethylenediamine) diacetato cobalt(III) trifluoroacetate |
| C-9 | triethylenetetramine dichloro cobalt(III) trifluoroacetate |
| C-10 | bis(methylamine) tetra-ammine cobalt(III) hexafluorophosphate |
| C-11 | aquopenta(methylamine) cobalt(III) nitrate |
| C-12 | chloropenta(ethylamine) cobalt(III) perfluorobutanoate |
| C-13 | trinitrotris-ammine cobalt(III) |
| C-14 | trinitrotris(methylamine) cobalt(III) |
| C-15 | tris(ethylenediamine) cobalt(III) perchlorate |
| C-16 | tris(1,3-propanediamine) cobalt(III) trifluoroacetate |
| C-17 | N,N'-ethylenebis(salicylideneimine) bis-ammine cobalt(III) perchlorate |
| C-18 | μ-superoxodeca-ammine dicobalt(III) perchlorate |
| C-19 | penta-ammine carbonato cobalt(III) perchlorate |
| C-20 | tris(glycinato) cobalt(III) |
| C-21 | trans[bis(ethylenediamine) chlorothiocyanato cobalt(III)]perchlorate |
| C-22 | trans[bis(ethylenediamine) diazido cobalt(III)]thiocyanate |
| C-23 | cis[ethylenediamine ammine azido cobalt(III)] trifluoroacetate |
| C-24 | tris(ethylenediamine) cobalt(III) benzilate |

TABLE V-continued

| | |
|---|---|
| C-25 | trans[bis(ethylenediamine) dichloro cobalt(III)]perchlorate |
| C-26 | bis(ethylenediamine) dithiocyanato cobalt(III) perfluorobenzoate |
| C-27 | triethylenetetramine dinitro cobalt(III) dichloroacetate |
| C-28 | tris(ethylenediamine) cobalt(III) salicylate |
| C-29 | tris(trimethylenediamine cobalt(III) trifluoroacetate |
| C-30 | tris(trimethylenediamine) cobalt(III) tetrafluoroborate |
| C-31 | tris(trimethylenediamine) cobalt(III) trifluoromethanesulfonate |
| C-32 | tris(ethylenediamine) cobalt(III) heptafluorobutyrate |

The reduction of the cobalt(III) complex can be initiated or activated directly by exposure to activating radiation having a wavelength less than about 300 nm. Or alternatively, it can be achieved by exposure of a photoactivator to radiation of a wavelength greater than about 300 nm. Such photoactivators include both photoreductants and spectral sensitizers, the former being effective even if exposed prior to being in contact with the cobalt(III) complex, such contact being achieved during development only. Spectral sensitizers in contrast must be exposed while in operative association with the complex.

A wide variety of photoreductants can be selected, including metal carbonyl, e.g., benzene chromium tricarbonyl; β-ketosulfide, e.g., 2-(4-tolylthio)chromanone; diketone, e.g., furil, carboxylic acid azide, e.g., 4-bromo-1-hydroxy-2-naphthoic acid azide; organic benzilate, e.g., N-methylacridinium benzilate; dipyridinium salt, e.g., N,N'-bis(2,4-dinitrophenyl)-4,4'-dipyridinium hexafluorophosphate; diazonaphtone, e.g., 4-diazo-2-methyl-1-naphthone; phenazine; phenazine-N-oxide; quinone; disulfide; diazoanthrone; diazonium salt; diazophenanthrone and aromatic azide; carbazide; diazosulfonate photoreductants; and the like. Further details of these, including an extensive list, are set forth in *Research Disclosure*, vol. 126, October 1974, Publication No. 12617, Part II, the details of which are expressly incorporated herein by reference. Still others which can be used include 2-isopropoxy-3-chloro-1,4-naphthoquinone, 2-dibenzylamino-3-methyl-1,4-naphthoquinone and 2-isopropoxy-1,4-anthraquinone.

Similarly, a wide variety of spectral sensitizers can be used. Preferably, the sensitizer is chosen to exhibit a ground state oxidation potential that is unfavorable for the reduction of the cobalt(III) complex. This relationship is preferable to avoid the spontaneous reduction of the cobalt(III) complex in the absence of actinic radiation. It is generally preferred that the ground state oxidation potential of the spectral sensitizer be related to the reduction potential of the cobalt(III) complex such that for an electron to be transferred from the spectral sensitizer to the cobalt(III) complex, it must exhibit a net energy gain. The adverse energy gradient then insures against reduction of the cobalt(III) complex in the absence of externally supplied energy. Examples include acridines, anthrones, azo dyes, azomethines, cyanines, mercocyanines, styryl and styryl base dyes, polycyclic hydrocarbon dyes, ketone dyes, nitro dyes, oxonols, sulfur dyes, triphenylmethane dyes, xanthene dyes, and the like. Further details of these, including an extensive list, are set forth in *Research Disclosure*, Vol. 130, February 1975, Publication No. 13023, Part III, the details of which are expressly incorporated herein by reference.

When either a photoreductant or a spectral sensitizer is utilized, the development of the exposed composition preferably includes a heating step to increase the reduction rate of the complex, and therefore the crosslinking of the polymer.

An amplifier can be employed with, e.g., in admixture with, the cobalt(III) complex, to increase the speed of the reaction. A highly useful class of such amplifiers are compounds containing a conjugated $\pi$-bonding system capable of forming at least a bidentate chelate with cobalt(III). As is well appreciated by those skilled in the art, conjugated $\pi$-bonding systems can readily be formed by combinations of atoms such as carbon, nitrogen, oxygen and/or sulfur atoms and typically include double-bond providing groups, such as vinyl, azo, azinyl, imino, formimidoyl, carbonyl and/or thiocarbonyl groups, in an arrangement that places the double bonds in a conjugated relationship. A variety of compounds are known to the art which include a conjugated $\pi$-bonding system capable of forming at least bidentate chelates. Exemplary preferred such chelating compounds include nitroso-arols, dithiooxamides, formazan, aromatic azo compounds, hydrazones and Schiff bases. Further details and an extensive list of such chelating compounds is set forth in the aforesaid *Research Disclosure*, Publication No. 1305, Part III, the details of which are expressly incorporated herein by reference.

The amplifiers function as reducing agent precursors for further reduction of cobalt(III) complex. The redox reaction which occurs to cause the amplification can be summarized as follows:

(i) Q (photoactivator) + $Co^{III} A_6$ (original ligands)

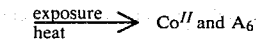

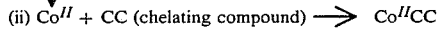

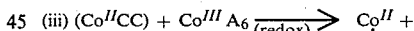

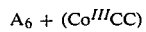

$A_6 + (Co^{III}CC)$

It is of course the amine ligands ($A_6$) which produce the photocrosslinking with the carbonyl groups of the polymeric binder.

Still other amplifiers which can be used are those which will react with released amines to form a further reducing agent. However, the reaction must not be so preferential for the amines that substantially none is left to crosslink the polymeric binder. For example, where a quinone is provided which is unsubstituted in at least one quinoid ring position adjacent a carbonyl group (e.g., a 2-or 3-ring position in the case of 1,4-benzoquinones and 1,4-naphthoquinones), an amine such as ammonia can react with the quinone at the unsubstituted ring position to form the corresponding amino-1,4-hydroquinone. The hydroquinone then is a reducing agent for the cobalt(III) complex to produce still more reduction products of the complex. The quinone can function initially as a photoreductant or a separate photoreductant can be incorporated initially to reduce the amine-containing cobalt(III) complex and liberate the amine.

In lieu of an amplifier, a chelating compound can be used having a higher affinity for Co(II) than do the ligands of Co(III). This will insure the release of the amine ligands after reduction has taken place, particularly if the ligands are diamines. One highly useful example of such a non-amplifying chelating compound is 2,2'-bipyridine.

As noted above, the major portion of the composition comprises the polymeric binder, and the minor portion, the cobalt(III) complex. The optional other ingredients, e.g., photoactivator and/or amplifier, can be present per mole of cobalt(III) complex, in amounts ranging between about 0.1 and about 20 moles, each. Highly useful amounts of the composition are those wherein the polymeric binder comprises between about 50 and about 95 mole percent of the composition, the cobalt(III) complex comprises between about 3 and about 49 mole percent, the photoactivator comprises between about 2 and about 25 mole percent, and the amplifier comprises between about 2 and about 25 mole percent.

ELEMENTS

An imaging element is prepared by forming a layer of the afore-described composition, preferably on a support. This can be done by coating the composition from solution onto a support.

The solvent selected will, of course, depend upon the makeup of the composition, particularly the polymeric binder. Typical preferred solvents which can be used alone or in combination are lower alkanols, such as methanol, ethanol, isopropanol, t-butanol, methoxyethanol and the like; ketones, such as methylethyl ketone, acetone, cyclopentanone and the like; chlorinated hydrocarbons, such as chloroform, ethylene chloride, carbon tetrachloride and the like; ethers, such as dioxane, diethyl ether, tetrahydrofuran, and the like; acetonitrile; dimethyl sulfoxide; dimethylformamide; and mixtures thereof.

A convenient range of coating coverage for the element is one in which the polymeric binder is between about 2 and about 100 mg/dm$^2$.

Any conventional photographic support can be used in the practice of this invention. Typical supports include transparent supports, such as film supports and glass supports, as well as opaque supports, such as metal and photographic paper supports. The support can be either rigid or flexible. The most common photographic supports for most applications are paper, including those with matte finishes, metal plates and transparent film supports, such as poly(ethylene terephthalate) film. Suitable exemplary supports are disclosed in *Product Licensing Index*, Volume 92, December 1971, Publication No. 9232, at page 108, published by Industrial Opportunities Ltd., Homewell, Havant, Hampshire, P09 1EF, UK. If ink-water differentiation is desirable, such as in using the invention for lithographic printing plates, the material selected for the support is preferably hydrophilic. This is because the photohardened composition of the invention is oleophilic. Typical examples of such hydrophilic supports include paper of metal plates.

The support can incorporate one or more subbing layers for the purpose of altering its surface properties so as to enhance the adhesion of the radiation-sensitive coating to the support. Typically, the solution is coated onto the support by such means as whirler coating, brushing, doctor-blade coating, hopper coating and the like. Thereafter, the solvent is evaporated. Other exemplary coating procedures are set forth in the *Product Licensing Index*, Volume 92, Dec. 1971, Publication No. 9232, at page 109. Addenda such as coating aids can be incorporated into the coating composition.

Imaging Process

A wide variety of imaging exposures can be utilized. It has been found, for example, that the exposure level can vary from between about 500 erg/cm$^2$ to about 10$^5$ erg/cm$^2$, at from about 300 to about 600 nm wavelength, depending on whether, to what extent, and which, amplifier and/or photoactivator is used in the composition.

Such exposure levels can be achieved by a variety of devices, all of which are conventional.

Preferably, development is a two-stage process, comprising first a heating step to activate the photocrosslinking in the exposed areas, and second a wash step to remove non-crosslinked polymer. The heating parameters are not critical. For example, the temperature can range between about 80° C. and about 160° C. for a time of between about 2 and about 100 seconds. Generally, the higher the temperature, the shorter the time that is required.

Although an understanding of the resulting reactions of the invention is neither necessary to the use of the invention nor even completely certain, it is believed that the crosslinking reaction that is completed during development proceeds by at least one of the following reaction, in the case where the active carbonyl group is an aldehyde:

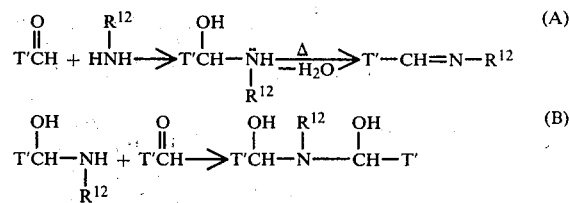

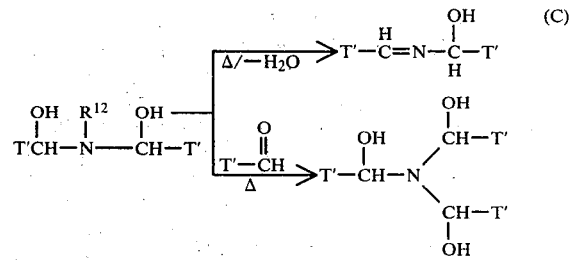

wherein R$^{12}$ is hydrogen, an organic group or an organic group containing one or more primary or secondary amine groups, and T' is the remainder of the polymer. As will be readily apparent, reaction (C) above is possible only in the case where R$^{12}$ is hydrogen, to permit the condensation reaction or the tertiary substitution of the amine.

Similar reaction steps can be described if the polymer is a ketone.

The unexposed polymer can be removed by a variety of steps. For example, a wash step can be achieved by immersing the exposed element, after heating, in an agitated, appropriately selected solvent. Such solvent is selected so as to wash away the unexposed polymer but not the crosslinked polymer. Useful examples include the solvents described above for the coating procedure, and in some cases, alkaline aqueous solvents. The time of such immersion is not critical, useful examples including times between about 5 and about 100 seconds.

Certain uses of the element of the invention can include further processing; for example, mordanted dyes, couplers, hardeners and/or metallization catalysts can be incorporated into the element by immersion in a suitable bath, before or after development, in a conventional manner.

EXAMPLES

The following examples further illustrate the nature of the invention:

EXAMPLE 1

In 1.8 gms of a 10% solution of

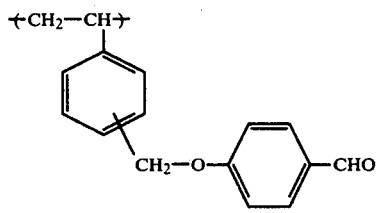

in A.C.S. grade tetrahydrofuran (THF) were dissolved 20 mg of 2-isopropoxy-1,4-naphthoquinoane photoactivator), and 5 mg of 2,2'-bipyridine. To this was added a solution of 20 mg [(NH$_2$[CH$_2$]$_3$NH$_2$)Co](CF$_3$CO$_2$)$_3$ [tris(trimethylenediamine) cobalt(III) trifluoroacetate], in 200 mg of 2-methoxyethanol. This dope was coated with a 100-micron doctor blade on subbed poly(ethylene terephthalate) support. The dried coating was given an exposure of 3200 erg/cm$^2$ at 350 nm and heated for 10 secs., coating side up, on a 90° C. hot block. Exposure was achieved by using a spectral sensitometer. The output radiation from an air-cooled, water-filtered, 1000-watt, high-pressure Xenon lamp was passed through quartz optics and was focused upon the entrance slits of a Bausch and Lomb high-intensity monochromator having an optical path length of ¼-meter. The output of the monochromator was filtered with broad bandpass filters to remove higher order radiation, then passed through a Uniblitz electronic shutter, and finally impinged upon the photographic material. Exposures were time-modulated to produce the range of exposures required. To compute the irradiance of the sensitometer, it was necessary first to determine the energy present in each of the wavelength regions at which the exposure was to be made. The irradiance per unit time was measured at a given exposure distance with a Hewlett-Packard Flux Meter, Model 8330nm A, and a Hewlett-Packard Flux Detector, Model 8334A. The 350 nm exposure of Example 1 was conducted at a wavelength near the $\lambda_{max}$ of the 2-isopropoxy-1,4-naphthoquinone ($\lambda_{max}$=327 nm) for an amount of time required to give an exposure of 3200 ergs/cm$^2$.

The coating was then immersed in an agitated mixture of 2:1, by volume, THF: p-dioxane. The unexposed areas were removed, leaving a negative image.

Example 2

This example demonstrates the use of speed-enhancing amplifiers.

The formulation was identical to that in Example 1 except that the 2,2'-bipyridine was replaced by 5 mg of 1-(2-pyridylazo)-2-naphthol (an amplifier). The dried coating was given an exposure of 1000 erg/cm$^2$ at 350 nm and processed as in Example 1. The unexposed areas were removed leaving a negative image.

Example 3

The formulation and coating procedures were identical to Example 1 except the polymer

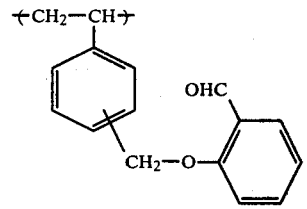

was employed. The dried coating was exposed for 0.5 secs. through a 1.0 neutral density step tablet in an IBM Microcopier IID exposure device. The exposed coating was heated face up for 5 secs. on a 140° C. hot block and agitated vigorously in a bath of dioxane. A clean negative relief image formed.

Example 4

To demonstrate usage on an offset printing press, in 20 gm of A.C.S.-grade acetone were dissolved:
160 mg of [(NH$_2$(CH$_2$)$_3$NH$_2$)$_3$Co](BF$_4$)$_3$' tris(trimethylenediamine) cobalt(III) tetrafluoroborate
200 mg of [(NH$_2$(CH$_2$)$_3$NH$_2$)$_3$Co](CF$_3$CO$_2$)$_3$' tris(trimethylenediamine) cobalt(III) trifluoroacetate
240 mg of [(NH$_2$(CH$_2$)$_3$NH$_2$)$_3$Co](CF$_3$SO$_3$)$_3$' tris(trimethylenediamine) cobalt(III)trifluoromethanesulfonate
800 mg of 2-isopropoxy-1,4-naphthoquinone (photoactivator)

To this solution were added 60.7 gm of A.C.S.-grade THF and 20 gms of a 20% cyclopentanone solution of the polymer utilized in Example 3.

This dope was whirl coated at 90 rpm on grained, anodized aluminum support. The coating was dried in a vacuum oven for 1 hour at 50° C. and then exposed for 2 minutes in a vacuum frame to a 1000 W medium pressure mercury lamp at a distance of about 1.22 m. The plate was then placed in a 135° C. oven for 90 secs., and finally developed by swabbing with a 1:1 mixture of ethyl propionate and Kodak "One-Step Desensitizer-Lacquer D" two-phase developing solution.

This plate was used to make 100 high-quality copies on an A. B. Dick Litho offset printing press.

There was no observable deterioration in the quality of the prints between the first and last copies.

Examples 5-17

The cross-linking of individual polymers was compared using the following standard test procedure:

To 2 g of a ten percent solution of the polymer in acetone were added 20 mg of 2-isopropoxy-1,4-naphthoquinone (a photoactivator), 12 mg of tris(trimethylenediamine)cobalt(III) trifluoroacetate and 5 mg of 2,2'-bipyridine. This solution was coated with a 100-micron doctor blade on subbed poly(ethylene terephthalate) support. The resulting film was exposed for 0.5 seconds through a 0.3 Log E silver step tablet on an IBM Microcopier II D exposure device and heated, face up, for 5 seconds on a hot block. The block temperatures used were between 140 and 160° C. and were not critical unless noted. The film was then swabbed with acetone to remove uncrosslinked areas, and the number of crosslinked steps was recorded by visual observaton or by using a dye in the acetone wash. Selected data are tabulated in Table VI. Except where noted, all of the polymers of these examples are oleophilic.

NOTE: Examples 9, 10 and 13 contained no 2,2'-bipyridine. The ratios given with the polymer names are the monomer molar ratios.

TABLE VI

| Example | Number of 0.3 Log E Steps | Polymer | {n}(dl/g) |
|---|---|---|---|
| 5 | 3 | Poly(m-formylphenylmethacrylate) | — |
| 6 | 3 | Poly(N-butyl-4-methacryloyloxybenzene-sulfonamide-co-m-formylphenyl methacrylate) (50:50) | 0.27 |
| 7 | 6 | Poly(N-butyl-4-methacryloyloxybenzene-sulfonamide-co-m-formylphenyl methacrylate) (50:50) | 1.34 |
| 8 | 8 | Poly(N-butyl-4-methacryloyloxybenzene-sulfonamide-co-m-formylphenyl methacrylate (67:33) | — |
| 9 | 1 | Poly(o-formylphenyl vinylbenzyl ether-co-methyl methacrylate) (50:50) | — |
| 10 | 4 | Poly[o-formylphenyl vinylbenzyl ether-co-methyl vinyl ketone] (50:50) | — |
| 11 | 2½ | Poly($N^1$-butyl-$N^4$-methacryloyl-sulfanilamide-co-o-formylphenyl vinylbenzyl ether) (50:50) | — |
| 12 | 4 | Poly(o-formylphenyl vinylbenzyl ether-co-4-vinylmethanesulfon-anilide) (50:50) | — |
| 13 | 3 | Poly(N-butyl-4-methacryloyloxy-benzenesulfonamide-co-o-formyl-phenyl vinylbenzyl ether) (50:50) | 0.59 |
| 14 | 6 | Poly(N-butyl-4-methacryloyloxy-benzenesulfonamide-co-o-formylphenyl vinylbenzyl ether) (50:50) | 0.68 |
| 15 | 7 | Poly(N-butyl-4-methacryloyloxy-benzenesulfonamide-co-o-formyl-phenyl vinylbenzyl ether) (67:33) | — |
| 16 | 4 | Poly[N-(4-formylbenzyl)hexamethylene-2,4-tolylenedisulfonamide] | — |
| 17 | 6 | Poly[mono-2-(4-formylphenoxy)ethyl maleate-co-methyl vinyl ether]*** | — |
| 18 | 4 | Polymer of Preparation 5 | — |
| 19 | 6 | Poly[m-formylphenyl methacrylate: N-(4-vinylphenyl)-p-toluene-sulfonamide] 50:50 | 0.48 |
| 20 | 2 | Poly[m-formylphenyl methacrylate: N-(p-toluenesulfonyl) methacrylamide]50:50 | 0.45 |
| 21 | 2 | Poly[m-formylphenyl methacrylate: N-phenyl-4-methacryloyloxybenzene sulfonamide] 50:50 | 0.10 |

These examples demonstrate enhanced speed, since at least 1 step, Example 9, was produced at only ½ sec. exposure, a speed that is at least equal to that achievable by most conventional lithographic printing plate compositions, when tested under similar conditions.

Example 22

Example 17 was repeated except that swabbing was done with a solution of 1.0 g of sodium carbonate and 0.8 g of sodium bicarbonate and 1.01 ml of 10% Surfactant 10 G (a nonylphenoxypolyglycerol), in 100 ml of water. Four crosslinked 0.3 Log E steps remained after this treatment.

Example 23

To demonstrate utility of an amplifier, in 1 g of 2-methoxyethanol were dissolved 23 mg of tris(ethylenediamine) cobalt(III) heptafluorobutyrate + 20 mg of tris(ethylenediamine) cobalt(III) trifluoromethane sulfonate. 0.4 g of this solution was added to 3.6 g of a 10% solution of poly(N-butyl-4-methacryloyloxybenzenesulfonamide-co-m-formylphenyl methracrylate) (50:50) in acetone. Under red safelights, 8 mg of 4-(2-pyridylazo) resorcinol (an amplifier), and 40 mg of 2-(dibenzylamino)-3-methyl-1,4-naphthoquinone (a photoactivator), were added. When dissolved, the solution was coated with a 25-micron doctor blade on grained, anodized aluminum support. The coating was given an exposure of 600 ergs/cm$^2$ at a wavelength of 500 nm, heated coating side up for 10 seconds on a 150° C. hot block and swabbed with acetone. A negative polymer image was formed of enhanced speed.

Examples 24–25

To 10 g of a 10% solution of the polymers of Table VII in acetone were added 100 mg of 2-isopropoxy-1,4-naphthoquinone, 60 mg of tris(trimethylenediamine)-cobalt(III) trifluoroacetate, and 25 mg of 2,2'-bipyridine. This solution was then coated at about 100-micron wet laydown on a subbed poly(ethylene terephthalate) film support. The resulting film was then dried, exposed to a 400-watt-medium-pressure mercury arc lamp through a 0.3 log E step tablet in an IBM Microcopier Model IID exposing device, and processed in the manner described in Table VIII. The processed samples were then swabbed with the coating solvent to remove non-crosslinked areas and the number of remaining crosslinked steps was recorded.

TABLE VII

| Example | Polymer |
|---|---|
| 24 | Imide-substituted ester of the formula<br><br>$\mathrm{+CH_2-CH+}$ 80(weight %) $\quad$ $\mathrm{+CH_2-CH+}$ 20<br>$\mid$ $\quad\quad\quad\quad\quad\quad\quad\quad\quad$ $\mid$<br>C=O $\quad\quad\quad\quad\quad\quad\quad\quad\quad$ C=O<br>$\mid$ $\quad\quad\quad\quad\quad\quad\quad\quad\quad\quad$ $\mid$<br>NH $\quad\quad\quad\quad\quad\quad\quad\quad\quad\quad$ O<br>$\mid$ $\quad\quad\quad\quad\quad\quad\quad\quad\quad\quad$ $\mid$<br>CH(CH$_3$)$_2$ $\quad\quad\quad\quad\quad$ (succinimidyl) |
| 25 | Imide-substituted ester of the formula<br><br>$\mathrm{+CH_2-CH+}$ 50 (weight %) $\quad$ $\mathrm{+CH_2-C(CH_3)+}$ 50<br>$\mid$ $\quad\quad\quad\quad\quad\quad\quad\quad\quad$ $\mid$<br>C=O $\quad\quad\quad\quad\quad\quad\quad\quad\quad$ C=O<br>$\mid$ $\quad\quad\quad\quad\quad\quad\quad\quad\quad\quad$ $\mid$<br>NH $\quad\quad\quad\quad\quad\quad\quad\quad\quad\quad$ NH<br>$\mid$ $\quad\quad\quad\quad\quad\quad\quad\quad\quad\quad$ $\mid$<br>CH(CH$_3$)$_2$ $\quad\quad\quad\quad\quad$ (CH$_2$)$_2$<br>$\quad\quad\quad\quad\quad\quad\quad\quad\quad\quad\quad$ C=O<br>$\quad\quad\quad\quad\quad\quad\quad\quad\quad\quad\quad$ O—(succinimidyl) |

TABLE VIII

| Example | Exposure (Secs.) | Process Condition (On a Hot Block) | No. 0.3 Log E Steps |
|---|---|---|---|
| 24 | 8 | 5 sec at 150° C. | 6 |
|  | 8 | 5 sec at 160° C. | 6 |
| 25 | 8 | 5 sec at 160° C. | 9 |
|  | 8 | 5 sec at 160° C. | 5 |

Example 26

To 0.8 g aqueous dispersion of a polymer having the recurring units

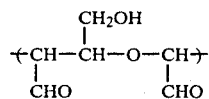

available commercially under the trademark "Sumstar-190" as a 25% anionic dispersion in water from the Miles Chemical Co., were added 0.2 g of 2-methoxyethanol, 20 mg of 2-($\beta$-hydroxyethyl)-1,4-naphthoquinone, 8 mg of tris(trimethylenediamine)cobalt(III) trifluoroacetate, and 1 g distilled water. This solution was then coated on a subbed poly(ethylene terephthalate) film support at a wet thickness of about 100 microns. The resulting film was then dried, exposed for 8 seconds in the IBM Microcopier IID to a step tablet and processed for 5 seconds on a 150° C. hot block. After swabbing with water, five 0.5 log E steps were visible.

Example 27

To 5 g of a 20% solution of a copolymer containing recurring units of the structure

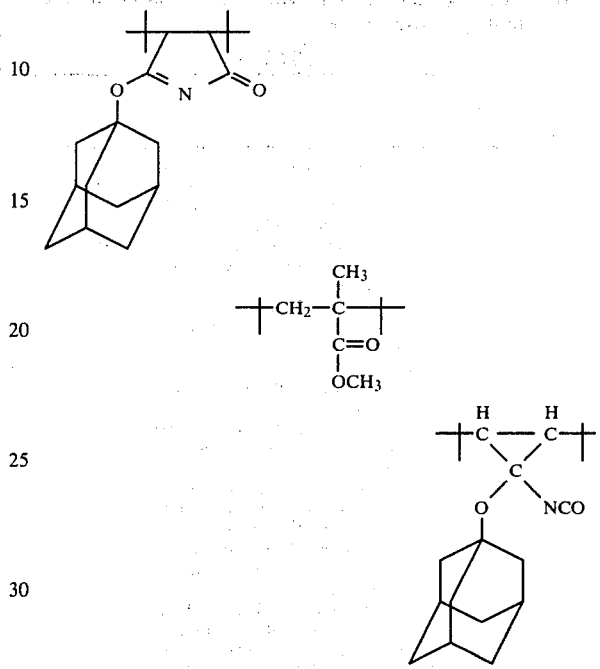

in 50/50 acetone/tetrahydrofuran were added 50 mg of tris(trimethylenediamine)cobalt(III) trifluoroacetate and 50 mg of 2-isopropoxy-1,4-naphthoquinone. This solution was then coated on a subbed poly(ethylene terephthalate) film support at a wet thickness of about 100 microns. The resulting film was then dried, exposed for ½ second in the IBM Microcopier IID to a step tablet and processed for 5 seconds at 120° C. Swabbing with the coating solvent mixture revealed six 0.3 log E crosslinked steps.

The invention has been described in detail with particular reference to a preferred embodiment thereof, but it will be understood that variations and modifications can be effected within the spirit and scope of the invention.

What is claimed is:

1. A photocrosslinked composition, comprising,
    as the major portion thereof, a polymeric binder containing a recurring unit bearing one or more carbonyl groups capable of reacting with an amine to form a crosslinked carbinolamine; and
    as a minor portion thereof, a thermally stable, reducible cobalt(III) complex containing amine ligands.

2. A composition as defined in claim 1 wherein said binder contains aldehyde groups as said carbonyl groups.

3. A composition as defined in claim 1, wherein said binder contains a recurring unit having the structure:

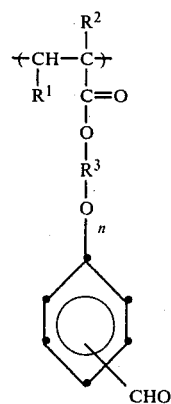

wherein
- R¹ is hydrogen or carboxyl,
- R² is hydrogen or alkyl containing from 1 to 3 carbon atoms,
- R³ is alkylene, phenylenedialkylene or alkylenephenylene containing from 1 to 5 carbon atoms in the alkylene portions, or phenylene,
- and n is 0 or 1.

4. A composition as defined in claim 1, wherein said binder contains a recurring unit having the structure:

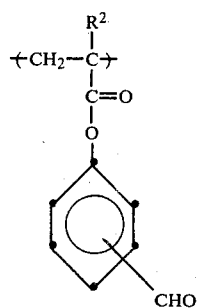

wherein R² is hydrogen or alkyl containing from 1 to 3 carbon atoms.

5. A composition as defined in claim 1, wherein said binder contains a recurring unit having the structure:

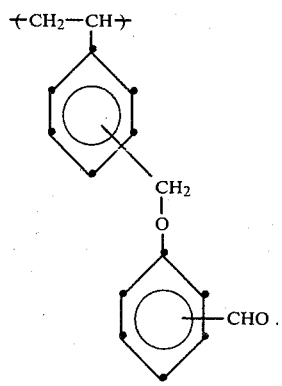

6. A composition as defined in claim 1, wherein said binder is a condensation polymer.

7. A composition as defined in claim 1, wherein said binder is a polymer containing recurring units with the structure:

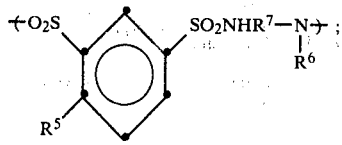

wherein
R⁵ is H or alkyl containing from 1 to 6 carbon atoms,
R⁶ is H or

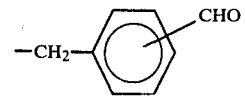

provided that in at least 10 mole % of the polymer, R⁶ is

and
R⁷ is alkylene containing from 1 to about 8 carbon atoms.

8. A composition as defined in claim 1, and further including a photoactivator capable of reducing said complex in response to activating radiation having a wavelength longer than about 300 nm.

9. A composition as defined in claim 1, and further including a reducing agent precursor capable in the presence of reduction products of said cobalt(III) complex, of reducing cobalt(III) complex to cause amplification of the crosslinking of said binder.

10. A photocrosslinked composition, comprising,
as the major portion thereof, a polymeric binder containing at least two recurring units having the structure:

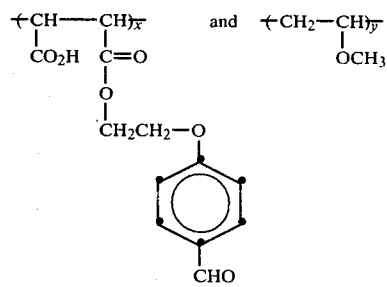

wherein x and y are molar amounts of the recurring units such that the ratio of x:y is from about 2:8 to about 2:1; and
as a minor portion thereof, a thermally stable reducible cobalt(III) complex containing amine ligands.

11. A composition as defined in claim 10 wherein said complex is tris(trimethylenediamine) cobalt(III) trifluoroacetate.

12. A photocrosslinkable composition, comprising, as the major portion thereof, a polymeric binder containing at least two recurring units having the structure:

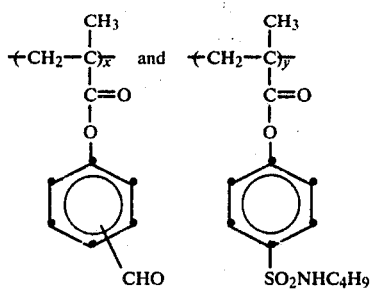

wherein x and y are molar amounts of the recurring units such that the ratio of x:y is from 2:8 to about 2:1; and as a minor portion thereof, a thermally stable, reducible cobalt(III) complex containing amine ligands.

13. A composition as defined in claim 12, wherein said complex is tris(trimethylenediamine) cobalt(III) trifluoroacetate.

14. A photocrosslinkable composition, comprising,
as the major portion thereof, a polymeric binder containing at least tow recurring units having the structure:

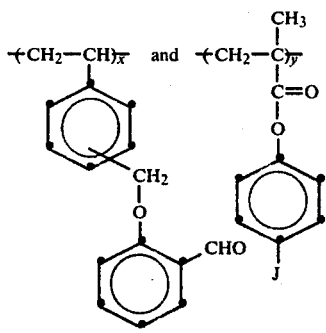

wherein J is $-SO_2NH-R^{10}$ or $-NHSO_2-R^{10}$, $R^{10}$ is alkyl containing from 1 to 5 carbon atoms and x and y are molar amounts of the recurring units such that the ratio of x:y is from about 2:8 to about 2:1; and as a minor portion thereof, a thermally stable, reducible cobalt(III) complex containing amine ligands.

15. A composition as defined in claim 14, wherein said complex is tris(trimethylenediamine) cobalt(III) trifluoroacetate.

16. A light-sensitive element, comprising a support bearing a photocrosslinkable layer comprising,
as the major portion thereof, a polymeric binder containing a recurring unit bearing one or more carbonyl groups capable of reacting with an amine to form a crosslinked carbinolamine;
and as a minor portion thereof, a thermally stable, reducible cobalt(III) complex containing amine ligands.

17. An element as defined in claim 16, wherein said binder contains aldehyde groups as said carbonyl groups.

18. An element as defined in claim 16, wherein said binder contains a recurring unit having the structure;

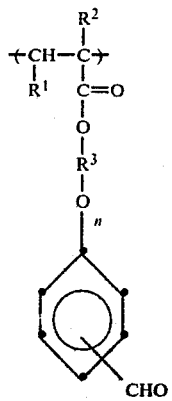

wherein
$R^1$ is hydrogen or carboxyl,
$R^2$ is hydrogen or alkyl containing from 1 to 3 carbon atoms,
$R^3$ is alkylene, phenylenedialkylene or alkylenephenylene containing from 1 to 5 carbon atoms in the alkylene portions, or phenylene,
and n is 0 or 1.

19. An element as defined in claim 16, wherein said binder contains a recurring unit having the structure:

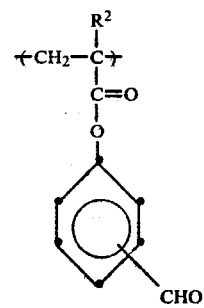

wherein $R^2$ is hydrogen or alkyl containing from 1 to 3 carbon atoms.

20. An element as defined in claim 16, wherein said binder contains a recurring unit having the structure:

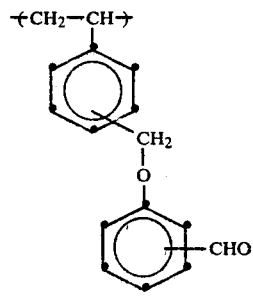

21. An element as defined in claim 17, wherein said layer includes a photoactivator capable of reducing said complex in response to activating radiation having a wavelength longer than about 300 nm.

22. An element as defined in claim 17, wherein said layer includes a reducing agent precursor capable in the presence of reduction products of said cobalt(III) complex, of reducing said cobalt(III) complex to cause amplification of the crosslinking of said binder.

23. A light-sensitive element useful in forming an ink-water discriminating image comprising
(a) a hydrophilic support, said support bearing
(b) a photocrosslinkable composition comprising
   (i) a thermally stable, reducible cobalt(III) complex containing amine ligands;
   (ii) an oleophilic polymer containing a recurring unit bearing one or more carbonyl groups capable of reacting with said amine to photocrosslink the polymer; and
   (iii) a reducing agent precursor capable of increasing the speed of said photocrosslinking by generating additional reducing agents for said complex in the presence of reduction products of said complex.

24. A method of imaging an element as defined in claim 23, comprising the steps of:
(a) exposing to activating radiation said photocrosslinkable composition of said element; and
(b) developing said exposed photocrosslinkable composition to form an image.

* * * * *

UNITED STATES PATENT AND TRADEMARK OFFICE
CERTIFICATE OF CORRECTION

PATENT NO. : 4,239,848
DATED : December 16, 1980
INVENTOR(S) : Anthony Adin and John C. Wilson It is certified that error appears in the above-identified patent and that said Letters Patent are hereby corrected as shown below:

Col. 3, lines 35-38, that part of the formula reading

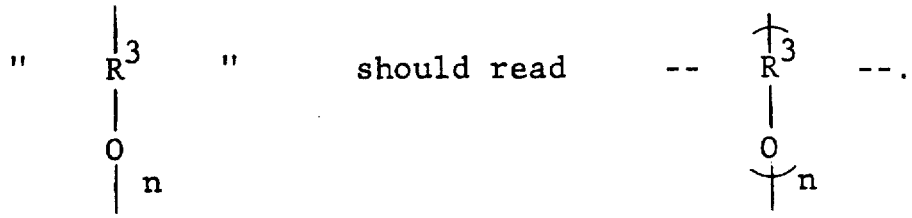

Col. 5, lines 7-12, that part of the formula reading

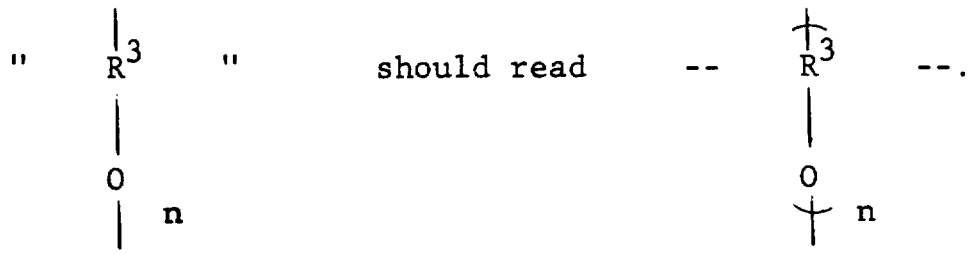

UNITED STATES PATENT AND TRADEMARK OFFICE
CERTIFICATE OF CORRECTION

PATENT NO. : 4,239,848

DATED : December 16, 1980

INVENTOR(S) : Anthony Adin and John C. Wilson

It is certified that error appears in the above-identified patent and that said Letters Patent are hereby corrected as shown below:

Col. 25, lines 7-10, that part of the formula reading

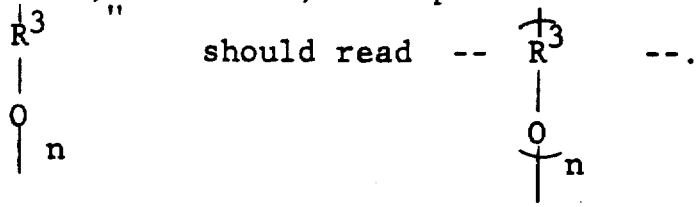

Col. 27, line 27, "tow", should read --two--.

Col. 28, lines 7-11, that part of the formula reading

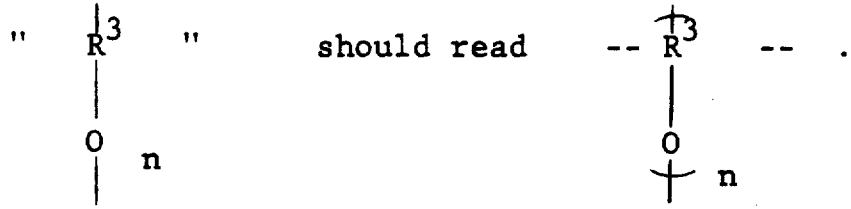

UNITED STATES PATENT AND TRADEMARK OFFICE
CERTIFICATE OF CORRECTION

PATENT NO. : 4,239,848
DATED : December 16, 1980
INVENTOR(S) : Anthony Adin and John C. Wilson It is certified that error appears in the above-identified patent and that said Letters Patent are hereby corrected as shown below:

Col. 28, line 62, "17", should read --16--.

Col. 28, line 66, "17", should read --16--.

Signed and Sealed this

Twenty-sixth Day of May 1981

[SEAL]

Attest:

RENE D. TEGTMEYER

*Attesting Officer*     *Acting Commissioner of Patents and Trademarks*